United States Patent
Ju et al.

(10) Patent No.: US 7,285,836 B2
(45) Date of Patent: *Oct. 23, 2007

(54) MAGNETIC RANDOM ACCESS MEMORY WITH STACKED MEMORY CELLS HAVING OPPOSITELY-DIRECTED HARD-AXIS BIASING

(75) Inventors: Kochan Ju, Monte Sereno, CA (US); Jei-Wei Chang, Cupertino, CA (US)

(73) Assignee: Maglabs, Inc., San Jose, CA (US)

( * ) Notice: Subject to any disclaimer, the term of this patent is extended or adjusted under 35 U.S.C. 154(b) by 350 days.

This patent is subject to a terminal disclaimer.

(21) Appl. No.: 11/075,900

(22) Filed: Mar. 9, 2005

(65) Prior Publication Data

US 2006/0202244 A1   Sep. 14, 2006

(51) Int. Cl.
 *H01L 29/82* (2006.01)
 *H01L 29/94* (2006.01)
 *G11C 11/50* (2006.01)

(52) U.S. Cl. ............... 257/421; 257/295; 257/E27.006; 365/158

(58) Field of Classification Search ................ 257/295, 257/E27.006, 421; 365/158, 173
See application file for complete search history.

(56) References Cited

U.S. PATENT DOCUMENTS

| | | | |
|---|---|---|---|
| 5,465,185 A | 11/1995 | Heim et al. | |
| 5,640,343 A | 6/1997 | Gallagher et al. | |
| 5,703,805 A | 12/1997 | Tehrani et al. | |
| 5,729,410 A | 3/1998 | Fontana, Jr. et al. | |
| 5,734,605 A | 3/1998 | Zhu et al. | |
| 5,768,181 A | 6/1998 | Zhu et al. | |
| 5,930,164 A | 7/1999 | Zhu | |
| 6,097,626 A | 8/2000 | Brug et al. | |
| 6,114,719 A | 9/2000 | Dill et al. | |
| 6,163,477 A | 12/2000 | Tran et al. | |
| 6,169,689 B1 | 1/2001 | Naji | |
| 6,590,806 B1 | 7/2003 | Bhattacharyya | |
| 6,633,498 B1 | 10/2003 | Engel et al. | |
| 6,724,652 B2 | 4/2004 | Deak | |
| 6,765,819 B1 | 7/2004 | Bhattacharyya et al. | |
| 6,801,451 B2 | 10/2004 | Tran et al. | |
| 6,822,838 B2 | 11/2004 | Lin et al. | |

(Continued)

OTHER PUBLICATIONS

Reohr et al., "Memories of Tomorrow", IEEE Circuits & Devices Magazine, Sep. 2002, pp. 17-27.
Pugh et al, IBM J. of Res & Develop, vol. 4, No. 2, 163.
Pugh et al, IBM J. of Res & Develop, vol. 4, No. 2, 163 (1960).

*Primary Examiner*—Long K. Tran (57) ABSTRACT

A magnetic random access memory (MRAM) has memory stacks arranged in the X-Y plane on the MRAM substrate, with each memory stack having two memory cells stacked along the Z axis and each memory cell having an associated biasing layer. Each biasing layer reduces the switching field of its associated cell by applying a biasing field along the hard-axis of magnetization of the free layer of its associated cell. The free layers in the two cells in each stack have their in-plane easy axes of magnetization aligned parallel to one another. Each biasing layer has its in-plane magnetization direction oriented perpendicular to the easy axis of magnetization (and thus parallel to the hard axis) of the free layer in its associated cell. The hard-axis biasing fields generated by the two biasing layers are in opposite directions.

31 Claims, 10 Drawing Sheets

U.S. PATENT DOCUMENTS

| | | |
|---|---|---|
| 6,829,162 B2 | 12/2004 | Hosotani |
| 2001/0026470 A1 | 10/2001 | Gillies et al. |
| 2002/0036331 A1 | 3/2002 | Nickel et al. |
| 2003/0161180 A1 | 8/2003 | Bloomquist et al. |
| 2005/0133840 A1* | 6/2005 | Pietambaram et al. ...... 257/295 |
| 2006/0267056 A1* | 11/2006 | Ju et al. ..................... 257/295 |

* cited by examiner

MAGNETIC RANDOM ACCESS MEMORY WITH STACKED MEMORY CELLS HAVING OPPOSITELY-DIRECTED HARD-AXIS BIASING

BACKGROUND OF THE INVENTION

1. Field of the Invention

This invention relates generally to magnetic random access memory (MRAM) and more particularly to MRAM with units or stacks of multiple memory cells for producing more than two logic states.

2. Description of the Related Art

MRAM with magnetic tunnel junction (MTJ) memory cells has been proposed for nonvolatile memory, as described in U.S. Pat. No. 5,640,343 and by Reohr et al., "Memories of Tomorrow", *IEEE CIRCUITS & DEVICES MAGAZINE*, September 2002, pp. 17-27. In these devices the MTJ cells are arranged as an array in a single layer (the X-Y plane) on a semiconductor substrate. In one type of architecture, called a 1T1MTJ MRAM (one transistor and one MTJ), each MTJ cell is located between a bit line and a transistor, with the word lines located beneath the MTJ cells. In another type of architecture, called a cross-point (XPC) MRAM, the MTJ cells are located directly between the bit and word lines.

In both MRAM architectures, a selected MTJ cell is programmed or "written", i.e., its magnetic state or +/−X magnetization direction is switched, by write currents passing in X and Y directions through the bit and word lines (the write lines) located above and below the selected MTJ cell. The write currents generate orthogonal magnetic fields in the X and Y directions that switch the magnetization direction of the selected MTJ cell. The typical writing scheme is a "half-select" scheme, where each of the bit and word lines generates half the required write field for switching the selected MTJ cell. However, the energized bit and word lines reduce the magnetic reversal energy barrier in the other cells along their respective bit and word lines. This makes these "half-selected" cells more susceptible to having their magnetic states switched when the selected cell is written.

MRAM with units or stacks of multiple memory cells located between the write lines to produce more than two magnetic states, and thus more than two logic states, have been proposed. Examples of this type of MRAM are described in U.S. Pat. Nos. 5,930,164; 6,169,689 B1; 6,590,806 B1; and 6,801,451 B2; and in Published Patent Application US 2002/0036331 A1.

In the prior art MRAM with multiple-memory-cell stacks, the individual memory cells have different shapes or are formed of different ferromagnetic materials and/or thicknesses so as to have different coercivities and/or anisotropies. This complicates the fabrication process. The write currents must also be kept within relatively narrow margins to avoid writing cells in non-selected stacks. In addition, writing to the cells in a selected stack requires both a series of write pulses and write pulses with different current values, which increases both the complexity of the write circuitry and the time to write.

What is needed is an MRAM with multiple-memory-cell stacks that has increased write-current margins and less complex write circuitry, and that does not require complex fabrication processes.

SUMMARY OF THE INVENTION

The invention is an MRAM with memory units or stacks arranged in the X-Y plane on the MRAM substrate with each memory stack having two memory cells stacked along the Z axis, and each memory cell having an associated biasing layer. Each biasing layer reduces the switching field of its associated cell by applying a biasing field along the hard-axis of magnetization of the free layer of its associated cell. The two cells in a stack are magnetically separated by a nonmagnetic separation layer. The free layers in the two cells in each stack have their in-plane easy axes of magnetization aligned parallel to one another. Each biasing layer has its in-plane magnetization direction oriented perpendicular to the easy axis of magnetization (and thus parallel to the hard axis) of the free layer in its associated cell. The hard-axis biasing fields generated by the two biasing layers are in opposite directions.

One or both of the biasing layers can be located in the stack and comprise a hard bias layer and a spacer layer between the hard bias layer and the associated free layer, with the hard-axis biasing field being applied across the spacer layer by magnetostatic coupling to the free layer. One or both of the biasing layers can be located outside the stack and comprise two hard bias segments, each segment being located on a respective side of the free layer.

The oppositely-directed hard-axis biasing fields do not change the shape of the switching astroids of the cells, but merely shift the astroids in opposite directions along the hard-axis direction. Thus the two cells can have the same uniaxial anisotropies, which enables the two cells to have the same shape in the X-Y plane and be formed of the same ferromagnetic materials with the same thicknesses. For this reason the same value of write current can be applied along both write lines to switch the magnetic states of the cells. Thus the MRAM write circuitry does not need to be capable of generating multiple levels or amplitudes of write current. The hard-axis biasing fields assist the write field, reducing the switching threshold. Thus less write current is required, which reduces the power consumption of the MRAM.

Each memory cell has an electrical resistance difference $\Delta R$ between the parallel and antiparallel alignment of its free and pinned layer magnetization directions. In one embodiment, the $\Delta R$ values of the two cells in a stack are different, so that each of the four possible magnetic states produced by the stack can be read by measuring the resistance across the stack. If the cells are magnetic tunnel junction (MTJ) cells, the $\Delta R$ values of the cells can be made different by fabricating the MTJ cells to have different tunnel barrier thicknesses.

For a fuller understanding of the nature and advantages of the present invention, reference should be made to the following detailed description taken together with the accompanying figures.

DETAILED DESCRIPTION OF THE INVENTION

Prior Art

Figure 1:
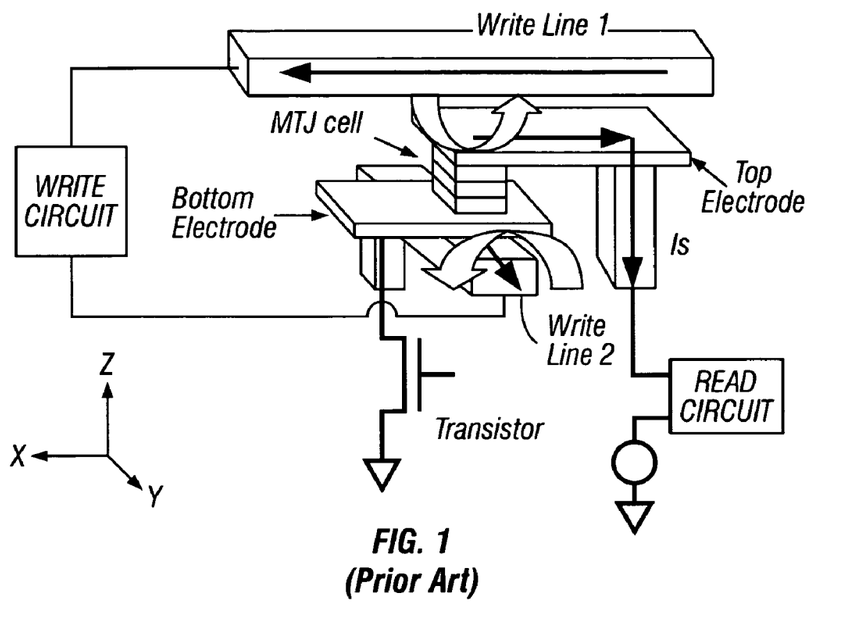
FIG. 1 is a perspective view of a portion of the prior art MRAM showing a single conventional MTJ memory cell and associated write and read circuitry.

FIG. 1 is a perspective view of a portion of the prior art a 1T1MTJ MRAM showing a single conventional MTJ memory cell, i.e., a memory cell with two magnetic states representing 0 and 1, with a free ferromagnetic layer whose magnetization direction (or magnetic moment) is switched by application of current through the write lines. The MTJ cell is located in an intersection region between a second write line (WL2) (aligned along the Y axis) and a first write line (WL1) (aligned along the X axis). The write lines are connected to a write circuit that provides the current pulses to perform the writing. Only one MTJ cell and intersection region is depicted in FIG. 1, but in the MRAM there are a plurality of generally parallel second write lines and a plurality of generally parallel first write lines that are orthogonal to the second write lines and overlap to define a plurality of intersection regions. Each intersection region contains an MTJ cell. Each MTJ cell is electrically connected to a transistor that is formed on the MRAM substrate (not shown). In the embodiment of FIG. 1 each MTJ cell is electrically connected to top and bottom electrodes that provide connection to the transistor and the resistance detection or read circuit.

Figure 2:
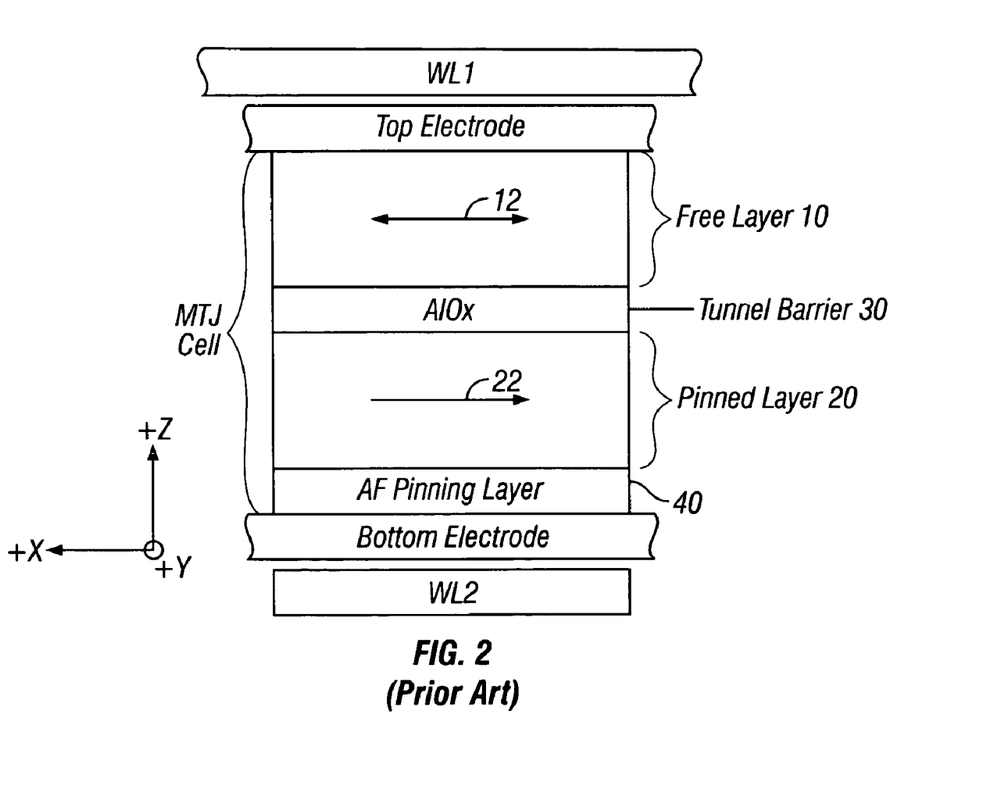
FIG. 2 is a sectional schematic showing the layers making up the prior art MTJ memory cell of FIG. 1.

FIG. 2 is a sectional schematic showing the layers making up the conventional MTJ cell. A free ferromagnetic layer 10 and a pinned ferromagnetic layer 20 are separated by a tunnel barrier 30, which is typically formed of alumina ($Al_2O_3$). The pinned ferromagnetic layer 20 has its magnetization direction (or magnetic moment) 22 pinned by being exchange coupled to antiferromagnetic (AF) pinning layer 40. The AF pinning layer 40 is typically a Mn alloy (e.g., PtMn, NiMn, FeMn, IrMn, PdMn, PtPdMn or RhMn). The pinned layer 20 may be a single ferromagnetic layer, as shown in FIG. 2, or a trilayer of a pinned ferromagnetic sublayer and a fixed ferromagnetic sublayer spaced apart by an antiferromagnetic coupling (AFC) layer, which is typically ruthenium (Ru). The trilayer type of pinned layer is the well-known antiparallel-pinned (AP-pinned) structure, also called a "laminated" pinned layer or a synthetic antiferromagnet (SAF), as described in U.S. Pat. No. 5,465,185. The AP-pinned structure minimizes magnetostatic coupling of the pinned layer 20 with the free layer 10. The free layer has its magnetization direction 12 oriented either parallel or antiparallel to the magnetization direction 22 of pinned layer 20.

The magnetic state of the MTJ cell is written, i.e., the magnetization direction 12 of free layer 10 is switched between +/−X directions, by write currents passing through write lines WL1, WL2, respectively, to generate write fields in the +/−X and +/−Y directions. The locus of composite write fields in the +/−X and +/−Y directions in all four quadrants sufficient to switch the magnetization direction of a cell has the general shape of an astroid, and is referred to as the cell's "switching astroid". Thus any composite field outside the astroid will switch the magnetic state of the cell and any composite field inside the astroid will not switch the magnetic state of the cell. The typical writing scheme is a "half-select" scheme, where each of the write lines generates part of the required write field for switching the selected MTJ cell. The magnetic state of the MTJ cell is read, i.e., the direction 12 of the free layer magnetization relative to the direction 22 of the pinned layer magnetization is detected, by turning on the transistor and measuring the resistance with the read circuit when a sense current $I_s$ flows through the MTJ cell.

MRAM with multiple memory cells located between the write lines to produce more than two magnetic states, and thus more than two logic states, have been proposed. An example of a memory unit or stack of two memory cells producing four bit states is described in U.S. Pat. No. 5,930,164 and shown in FIG. 3. The memory unit 50 has two memory cells (cell 1 and cell 2) of different lengths and widths, which results in different resistances and anisotropies. The different resistances of the memory cells enable four magnetic states to be detected. Uniaxial magnetic anisotropy of a ferromagnetic layer means essentially that all of the magnetic domains tend to align along the same axis, referred to as the easy axis, which is the lowest energy state. The anisotropy field $H_k$ of a ferromagnetic layer with uniaxial magnetic anisotropy is the magnetic field that would need to be applied along the easy axis to switch the magnetization direction. Thus cell 2 has a higher anisotropy field $H_k$ than cell 1. While the two cells have different anisotropies they have parallel uniaxial anisotropy directions, i.e. parallel to the X axis. The two cells are connected in series in the Z direction by a conductive separation layer. The selective writing of the two cells requires multiple write pulses and write-current values. The high-anisotropy cell (HAC) (the larger cell 2) is written first and then the low-anisotropy cell (LAC) (cell 1) is written, with the LAC being written with a write field sufficient to switch the LAC but not the HAC. The scheme for reading the four magnetic states involves using multiple reference voltages, as described in U.S. Pat. No. 6,169,689 B1.

Figure 3:
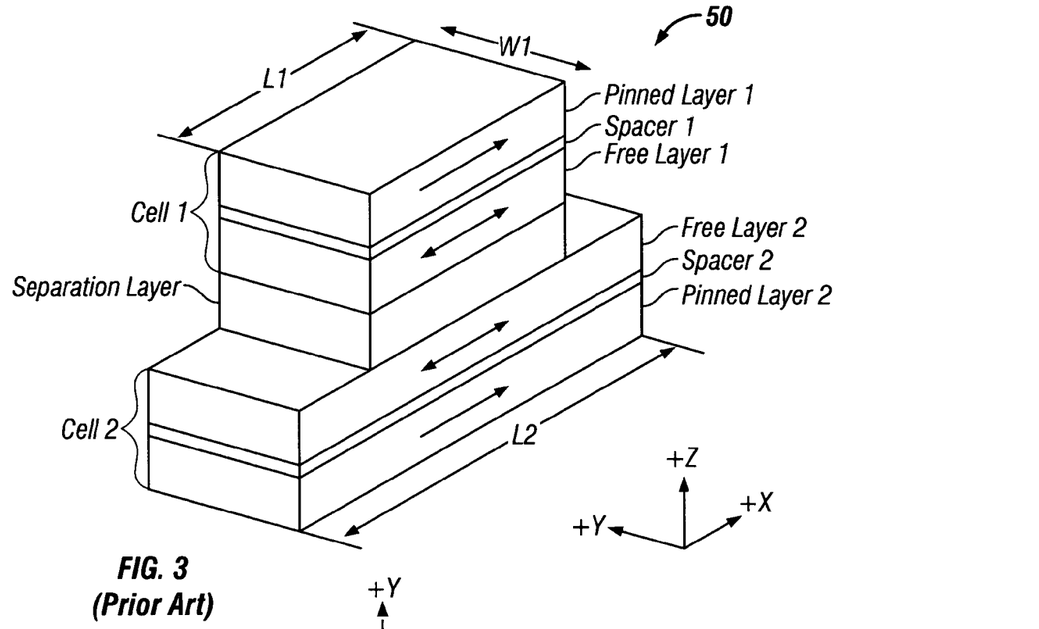
FIG. 3 is a perspective view of a prior art two-cell memory unit or stack with the easy axes of the two cells being parallel, but with the cells having different dimensions, resulting in different resistances and anisotropies.

As can be appreciated from FIG. 3, additional lithographic processing steps are required to fabricate the two cells with different shapes. If it was desired to have the two cells have the same shape, then different ferromagnetic materials would have to be used for the two cells to create the different anisotropies, which would complicate the fabrication process.

A problem arises in an MRAM that has memory units of multiple stacked memory cells because as the units become densely packed in the X-Y plane the "half-selected" unit may be switched when a nearby adjacent unit is written. To prevent the half-selected units from switching, the maximum X and Y direction write fields allowed for writing the HACs is capped at the minimum anisotropy ($H_k$) of the LACs sharing the write lines. In addition, the switching field for the LACs has to be kept low enough to not switch the weakest HAC sharing the write lines. As a result of this half-select constraint, the write-current margin is severely degraded. Even assuming the unlikely case where all cells are identical and thus have an identical switching astroid, the write-current window is reduced by about 50% as compared to the conventional single-memory-cell MRAM (FIG. 2). To allow for a +/−25% switching threshold variation among the cells, there is essentially no write-current margin.

Figure 4A:
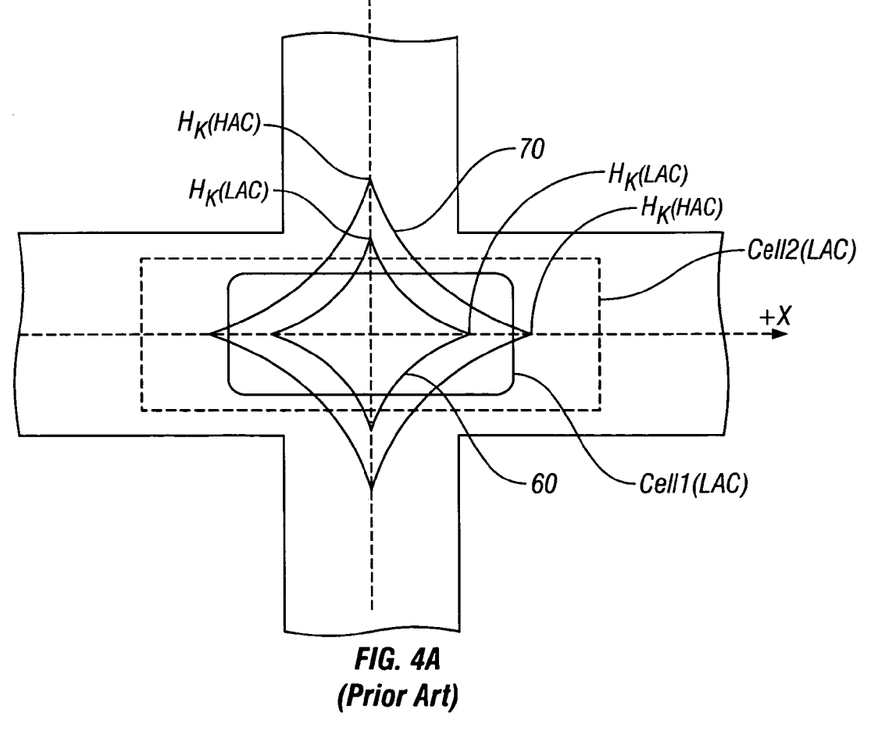
FIG. 4A shows the switching astroids for the prior art memory unit depicted in FIG. 3 superimposed on the two cells.
Figure 4B:
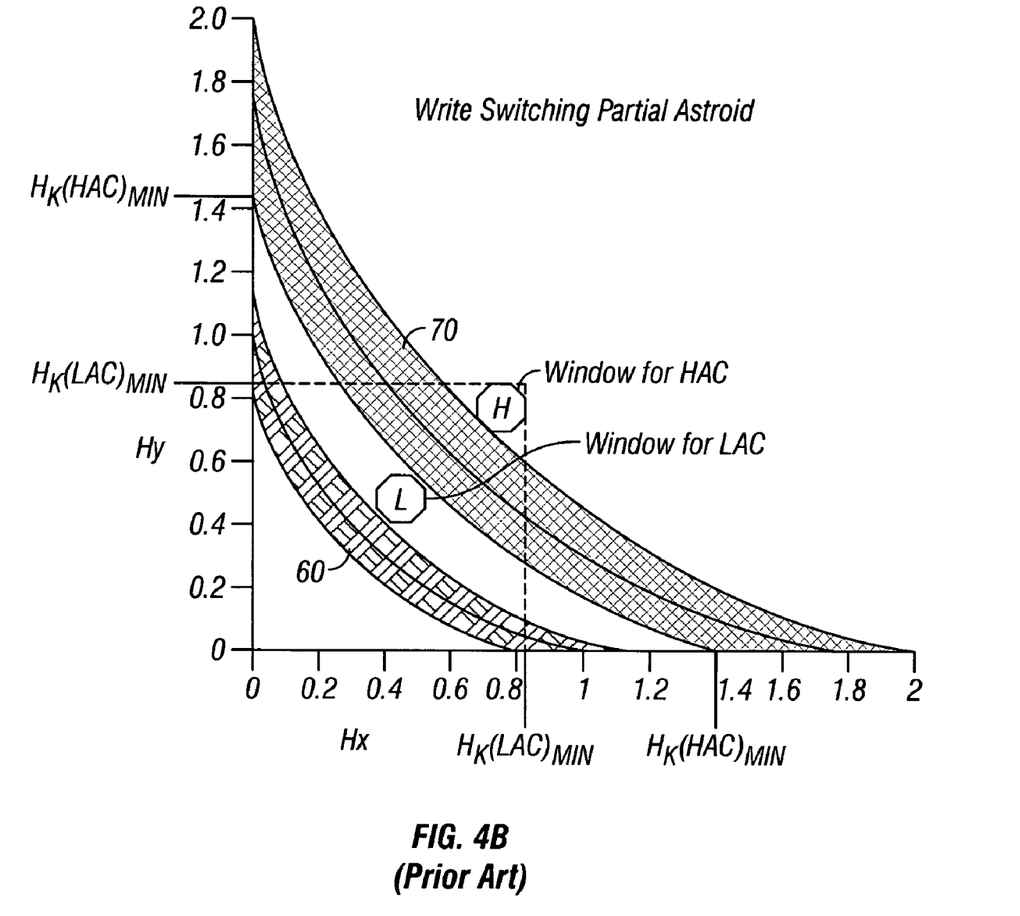
FIG. 4B shows the switching astroid and write-current windows in the first-quadrant for the prior art memory unit depicted in FIG. 3.

This problem is illustrated in FIGS. 4A and 4B. FIG. 4A shows the switching astroids for a memory unit with multiple memory cells (cell 1 and cell 2) as depicted in FIG. 3 superimposed on cells 1 and 2. Astroid with outer band 60 represents the switching astroid for cell 1 and astroid with outer band 70 represents the switching astroid for cell 2. FIG. 4B is a detailed view of the positive X and Y quadrant of the two switching astroids of FIG. 4A. The easy axis of the free layer in each cell is along the X direction so any field greater than $H_k(LAC)$ along the X direction will switch the magnetization direction of cell 1, and any field greater than $H_k(HAC)$ along the X direction will switch the magnetization direction of cell 2. In FIG. 4, a +/−15% variation of $H_k$ for the cells is assumed for the purpose of illustration. The switching astroid distribution is shown by band 60 for the LAC and band 70 for the HAC. Thus any composite field from a combination of fields along the X and Y directions will switch the magnetization direction of the free layer of the LAC if it is greater than the outer boundary of band 60, and any composite field from a combination of fields along the X and Y directions will switch the magnetization direction of the free layer of the HAC if it is greater than the outer boundary of band 70. The octagonal-shaped regions marked "H" and "L" correspond to the write-current windows for writing the HAC and LAC, respectively. Region "H" is inside the rectangle on FIG. 4B and bounded on the upper end by the X and Y write fields that do not exceed the minimum of $H_k$ for the LAC to ensure that writing does not also switch the magnetizations of the half selected LACs, i.e., $H_X<H_k(LAC)_{MIN}$ and $H_Y<H_k(LAC)_{MIN}$. Region "H" is bounded on the lower end by the X and Y write fields that must exceed the outer boundary of switching astroid band 70 to ensure the successful writing of all HACs. Region "L" is also inside the rectangle in FIG. 4B and well below the X and Y write fields that exceed the minimum of $H_k$ for the LAC to ensure that writing does not also switch the magnetizations of the half selected LACs, i.e., $H_X<H_k(LAC)_{MIN}$ and $H_Y<H_k(LAC)_{MIN}$. Region "L" is bounded on the upper end by the X and Y write fields that would exceed the inner boundary of switching astroid band 70 to assure that writing to the LACs does not also switch the magnetizations in the HACs. Region "L" is bounded on the lower end by X and Y write fields that must exceed the outer boundary of switching astroid band 60 to ensure the successful writing of all LACs. Thus the composite of write fields $H_X$ and $H_Y$ needs to be above the maximum LAC astroid band 60 to assure writing of LACs and below the minimum HAC astroid band 70 to avoid switching the magnetizations of the HACs. As can be seen from the "L" and "H" regions in FIG. 4B, there are relatively narrow operating windows available to reliably write to an MRAM with memory units composed of multiple memory cells according to the prior art. In addition, the write circuitry must be capable of generating at least two levels or amplitudes of write current.

The Invention

Figure 5:
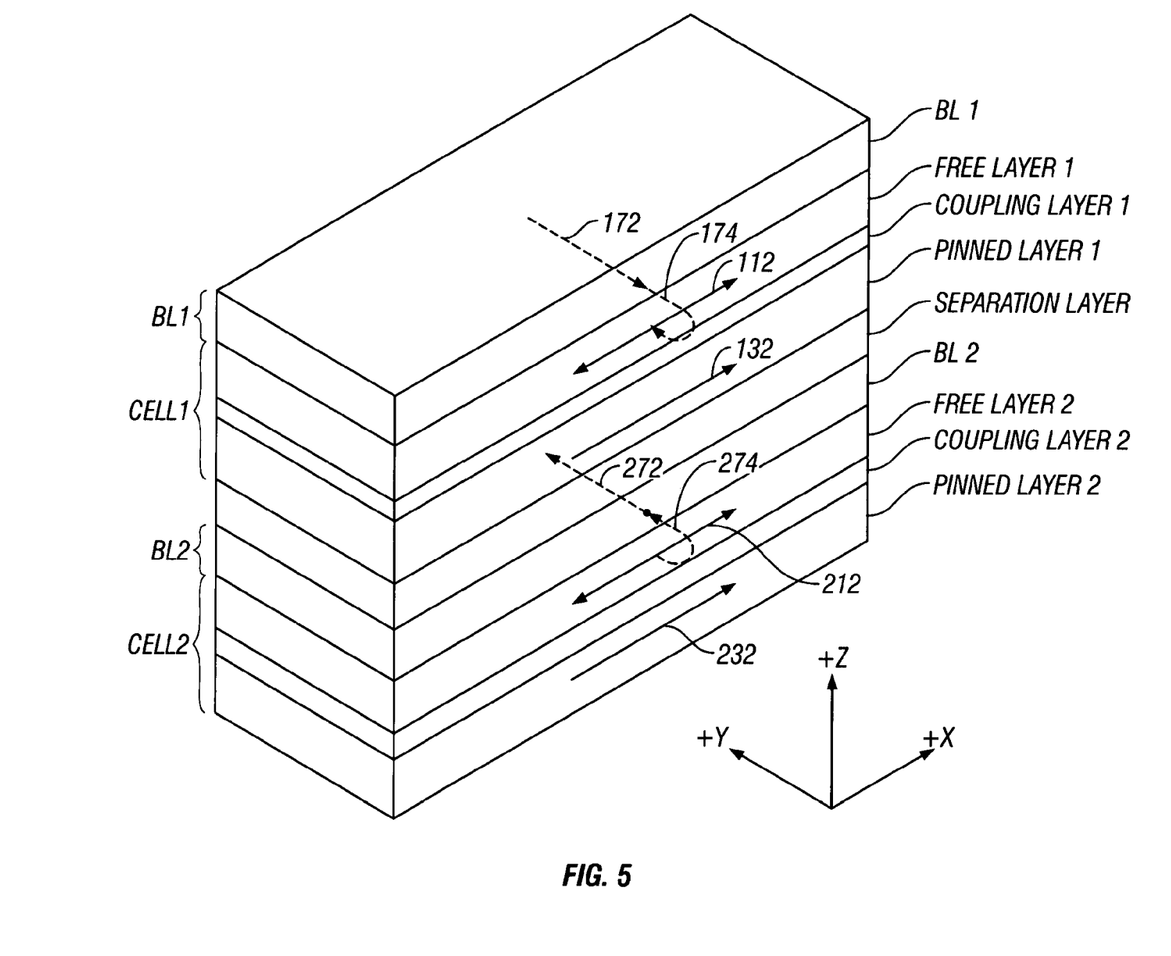
FIG. 5 is a perspective view of a two-cell memory unit according to the present invention.

The invention is an MRAM having memory units of stacked memory cells in each intersection region, with each memory cell having its free layer magnetization direction biased by a biasing layer having its magnetization direction aligned generally parallel to the hard axis of magnetization of the free layer. In the case of two stacked memory cells the magnetization directions of the two hard-axis biasing layers generate hard-axis biasing fields that are in opposite directions (antiparallel). FIG. 5 shows the structure of the memory unit schematically. Each cell is depicted as having a generally rectangular shape, which is meant to represent that the cell's free layer has shape anisotropy with the long axis of the rectangle being the easy axis (parallel to the X axis) and the short rectangle axis (the axis perpendicular to the long axis) being the hard-axis. Numerous other shapes besides the rectangular shape are possible to provide uniaxial anisotropy induced by the shape of the cell. The easy axes of magnetization of the free layers of both cells 1 and 2 are generally parallel to the X axis, so that the hard axes of magnetization of the free layers of both cells 1 and 2 are parallel to the Y axis. A first biasing layer (BL1) is associated with cell 1 and has a magnetization direction 172 oriented in the −Y direction generally orthogonal to the easy axis of free layer 1 and generally parallel to the hard axis of free layer 1. A second biasing layer (BL2) is associated with cell 2 and has a magnetization direction 272 oriented in the +Y direction generally orthogonal to the easy axis of free layer 2 and generally parallel to the hard axis of free layer 2. BL1 is magnetostatically coupled to free layer 1 at their respective edges, as represented by dotted line 174, and thus applies a hard-axis biasing field to free layer 1 in the +Y direction. BL2 is magnetostatically coupled to free layer 2 at their respective edges, as represented by dotted line 274, and thus applies a hard-axis biasing field to free layer 2 in the −Y direction. The hard-axis biasing (HAB) of each free layer by its associated biasing layer reduces the switching field of the free layer, as will be described below.

Figure 6:
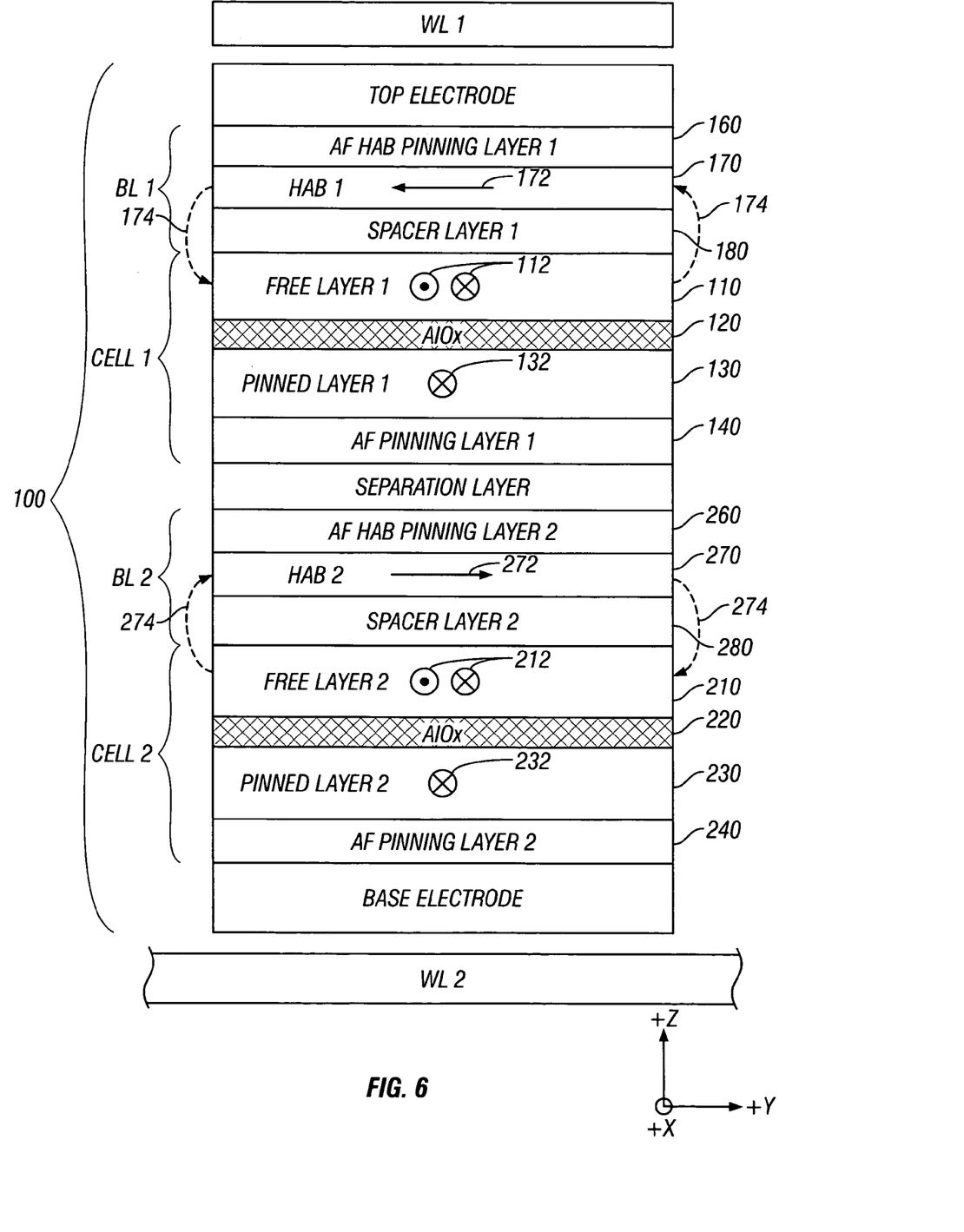
FIG. 6 is a sectional view of the memory unit of FIG. 5 showing the layers making up the memory unit, including the biasing layers associated with the individual memory cells.

FIG. 6 is a sectional schematic showing the layers making up the two MTJ cells in the memory unit 100 located in the intersection region between two write lines WL1 and WL2. The two cells are substantially similar, but cell 1 is stacked on top of cell 2 with a nonmagnetic separation layer between the two cells. Cell 1 has a free layer 110 and a pinned layer 130 separated by a tunnel barrier 120. Cell 2 has a free layer 210 and a pinned layer 230 separated by a tunnel barrier 220. The tunnel barriers 120, 220 are typically formed of alumina ($Al_2O_3$). The free layer 110 has its magnetization direction 112 oriented parallel to the X axis and either parallel or antiparallel to the magnetization direction 132 of pinned layer 130, with the magnetization direction 132 being pinned by pinned layer 130 being exchange coupled to antiferromagnetic (AF) layer 140. The free layer 210 has its magnetization direction 212 also oriented parallel to the X axis and either parallel or antiparallel to the magnetization direction 232 of pinned layer 230, with the magnetization direction 232 being pinned by pinned layer 230 being exchange coupled to antiferromagnetic (AF) layer 240. The pinned layers 130, 230 may be conventional single ferromagnetic layers or AP-pinned structures. A relatively wide range of materials and thicknesses are known for use in MTJ memory cells, but representative examples are 2-4 nm of CoFe or CoFe/NiFe bilayers for the ferromagnetic free layers, 5 to 15 nm of IrMn or PtMn for the AF pinning layers, and 0.5-3.0 nm of alumina ($Al_2O_3$) for the tunnel barriers. While not depicted in FIG. 6, seed layers may be located beneath the AF pinning layers and a capping layer may be located beneath the top electrode. The nonmagnetic separation layer can be a nonmagnetic electrically-conductive material such as Cu or NiCu with a thickness of approximately 10 to 100 nm. The nonmagnetic separation layer provides electrical connection between the two cells while magnetically and physically separating the two cells. The memory cells in FIG. 6 are depicted as MTJ cells, in which case the nonmagnetic coupling layers that couple the pinned and free ferromagnetic layers are the insulating tunnel barriers. However, other types of memory cells have been proposed, such as current-perpendicular-to-the-plane spin valve (CPP-SV) memory cells, in which case the nonmagnetic coupling layers are electrically conducting spacer layers, typically Cu.

Cell 2 has a biasing layer BL2 associated with free layer 210 and cell 1 has a biasing layer BL1 associated with free layer 110. In the embodiment of FIG. 6 each biasing layer is located in the stack of layers making up the memory unit 100 and comprises a hard-axis bias (HAB) layer, an AF HAB pinning layer exchange coupled to the HAB layer, and a spacer layer between the HAB layer and the associated free layer. Each of HAB1 (layer 170) and HAB2 (layer 270) is formed of a ferromagnetic material, such as an alloy of one or more of Co, Ni and Fe. Each of the spacer layers (layers 180, 280) is a nonmagnetic material, such as Ta or NiCr, that physically separates the HAB layer from its associated free layer and thus prevents direct ferromagnetic coupling of the HAB with its associated free layer. HAB1 170 has a magnetic moment 172 in the −Y direction and HAB2 270 has a magnetic moment 272 in the +Y direction. This enables the two HAB layers to generate hard-axis biasing fields that are antiparallel. However, each HAB has its moment parallel to the hard axis of its associated free layer which results in magnetostatic coupling with its associated free layer across the spacer layer. This is depicted for HAB1 170 and free layer 110 by dotted lines 174 representing a hard-axis biasing field in the +Y direction, and for HAB2 270 and free layer 210 by dotted lines 274 representing a hard-axis biasing field in the −Y direction.

The process for fabricating the MRAM with memory units 100, like that depicted in FIG. 6, uses well-known film deposition and lithographic processes, but will be briefly described here. There are two types of AF pinning materials used in the industry. The Type I AF materials, such as NiMn, PtMn and PtPdMn, require a magnetic annealing time on the order of a few hours to set or alter the exchange direction. The Type II AF materials, such as FeMn and IrMn, require a very short magnetic annealing time, on the order of nanoseconds to set or alter the exchange direction. The memory unit 100 shown in FIG. 6 calls for three different AF exchange directions during fabrication. This can be achieved by using materials with three different blocking temperatures, Tb, where $Tb1>Tb2>Tb3$. The Type I AF pinning material with the highest temperature Tb1 is chosen for AF pinning layers 240 and 140. The Type II AF pinning materials with the properties of Tb2 and Tb3 are used for AF HAB pinning layer 2 (layer 260) and AF HAB pinning layer 1 (layer 160), respectively.

The fabrication begins with the MRAM wafer having WL2 and the base electrode already formed on it. A suitable seed layer is deposited on the base electrode layer, followed by deposition of the AF pinning layer 240 and the pinned layer 230. The tunnel barrier 220 of MTJ cell 2 is then formed by deposition of an aluminum film followed by oxidation to form the alumina tunnel barrier. The free layer 210 is then deposited over the tunnel barrier 220. The nonmagnetic spacer layer 280 is then deposited and followed by the hard-axis bias layer 270 and the AF pinning layer 260. This completes the deposition of materials for cell 2. The cell 1 material deposition process is essentially the same as that of cell 2. The top electrode deposition completes the deposition process.

The annealing process is achieved with temperature above Tb1, typically 280 deg C., with a magnetic field applied along the X axis direction for a few hours to set the AF pinning directions for AF pinning layers 240, 140 for both cell 1 and cell 2. The wafer then undergoes a flash annealing with a magnetic field applied in the +Y direction to set the exchange direction for AF HAB pinning layer 2 (layer 260) for cell 2. The annealing time is on the order of a few minutes with the temperature above the blocking temperature Tb2 but below the blocking temperature Tb1. Next, a second flash annealing is applied with a magnetic field in the −Y direction and with the temperature set below Tb2 but above Tb3. This sets the exchange direction for AF HAB pinning layer 1 (layer 160). Finally, the wafer goes through an annealing without a magnetic field with temperature below Tb3 to recover some of the loss of the exchange strength due to the prior annealing.

It is also possible to fabricate the memory unit of FIG. 6 by using AF pinning materials with only two blocking temperatures ($Tb1>Tb2=Tb3$). The same Type II AF pinning material is used for AF HAB pinning layer 2 (layer 260) and AF HAB pinning layer 1 (layer 160). The fabrication proceeds with the same sequences as described above through the deposition of the spacer layer 1 (layer 180). An oxidation protection layer such as Cu or Ru is then deposited. The wafer then undergoes magnetic annealing for the AF pinning layers (layer 240 and layer 140) and flash annealing for AF HAB pinning layer 2 (layer 260) with the same annealing processes described above. The wafer is then put back into the vacuum system. The oxidation protection layer is removed and HAB1 (layer 170) and AF HAB pinning layer 1 (layer 160) are deposited in the presence of a magnetic field applied in −Y direction. With the layer 160 being a Type II AF material, the exchange direction can be defined by this deposition process. Following the top electrode deposition, the wafer goes through an annealing without a magnetic field to improve the exchange strength and thus complete the process.

Figure 7A:
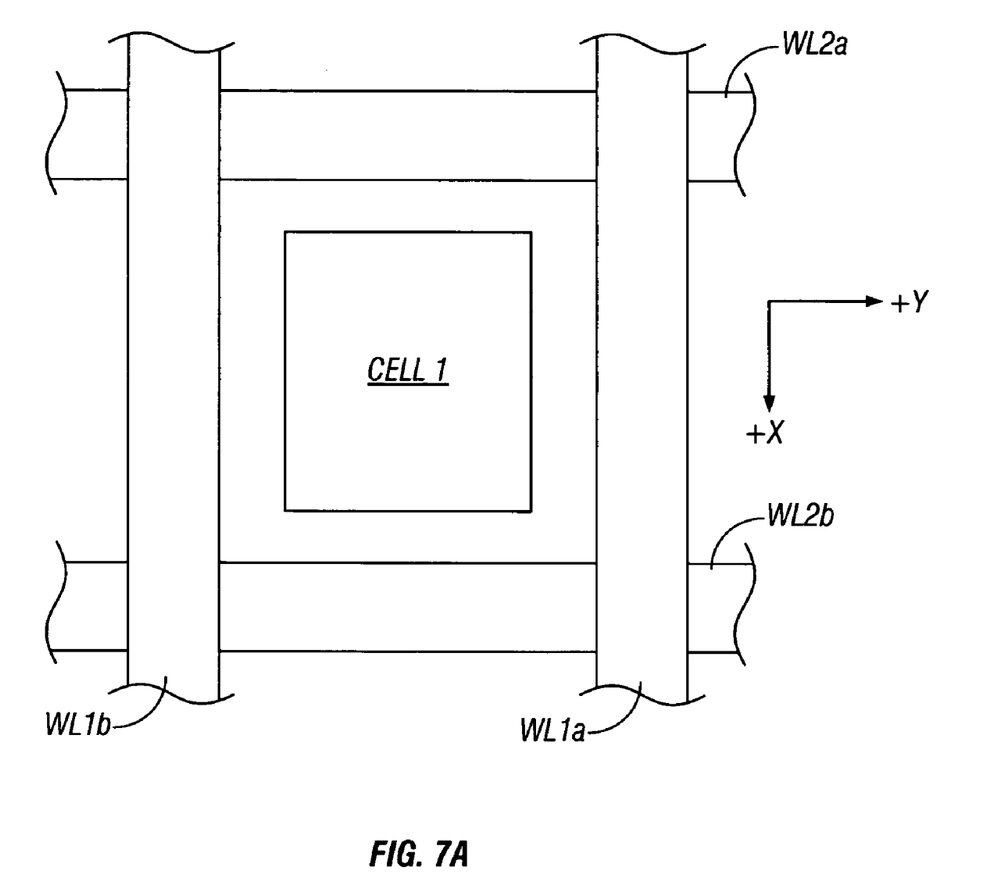
FIG. 7A is a top view of a two-cell memory unit according to the present invention with each write line being a pair of coplanar write lines spaced on the sides of the memory unit near the top and bottom of the unit.
Figure 7B:
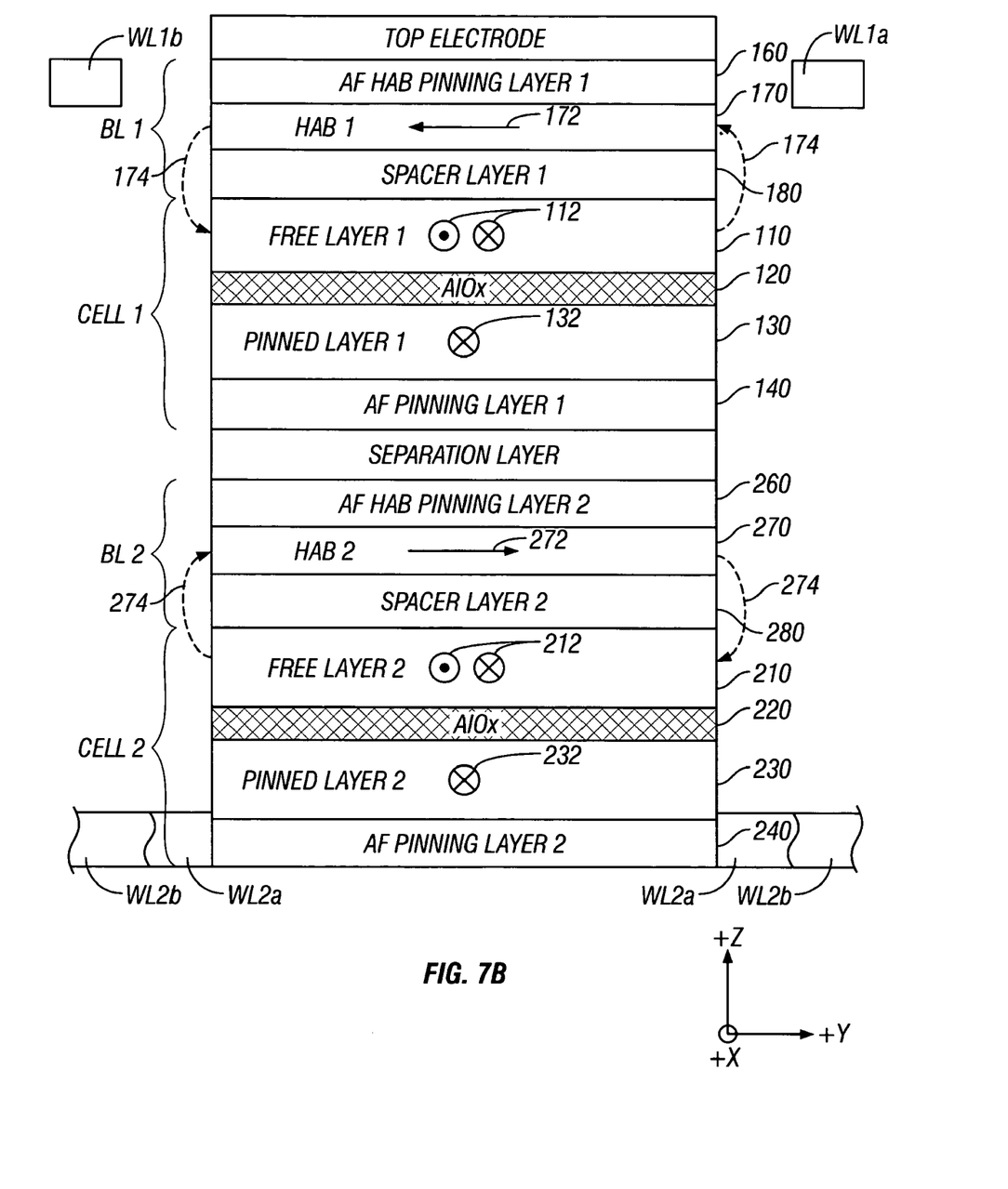
FIG. 7B is a sectional schematic showing the layers making up the two-cell memory unit depicted in FIG. 7A.

FIG. 6 depicts the write lines WL1 and WL2 directly above and below the cells and aligned with the X and Y axes, respectively. However, each write line can be a pair of coplanar write lines spaced on the sides of the memory unit, near the top and bottom of the unit, with the memory cells located in the intersection region between the top and bottom pairs of overlapping write lines, as depicted in FIGS. 7A-7B. Thus, write line 2 can be a pair of coplanar write lines WL2a, WL2b spaced on the sides of bottom memory cell 2 and aligned parallel to the Y axis, and write line 1 can be a pair of coplanar write lines WL1a, WL1b spaced on the sides of top memory cell 1 and aligned parallel to the X axis. Write current directed in the same direction in WL1a and WL1b will generate a magnetic field along the Y axis substantially in the planes of the free layers 110, 210 in the memory unit, and write current directed in the same direction in WL2a and WL2b will generate a magnetic field along the X axis substantially in the planes of the free layers 110, 210 in the memory unit.

In the embodiment shown in FIG. 6 each biasing layer BL1, BL2 includes an HAB layer that has its magnetic moment pinned by being exchange coupled to an AF HAB pinning layer. However, one of more of BL1 and BL2 can have its HAB layer and AF HAB pinning layer replaced by a hard (relatively high coercivity) or permanent ferromagnet, such as a ferromagnet made of a CoPt alloy, like a CoPtCr alloy.

Figure 8:
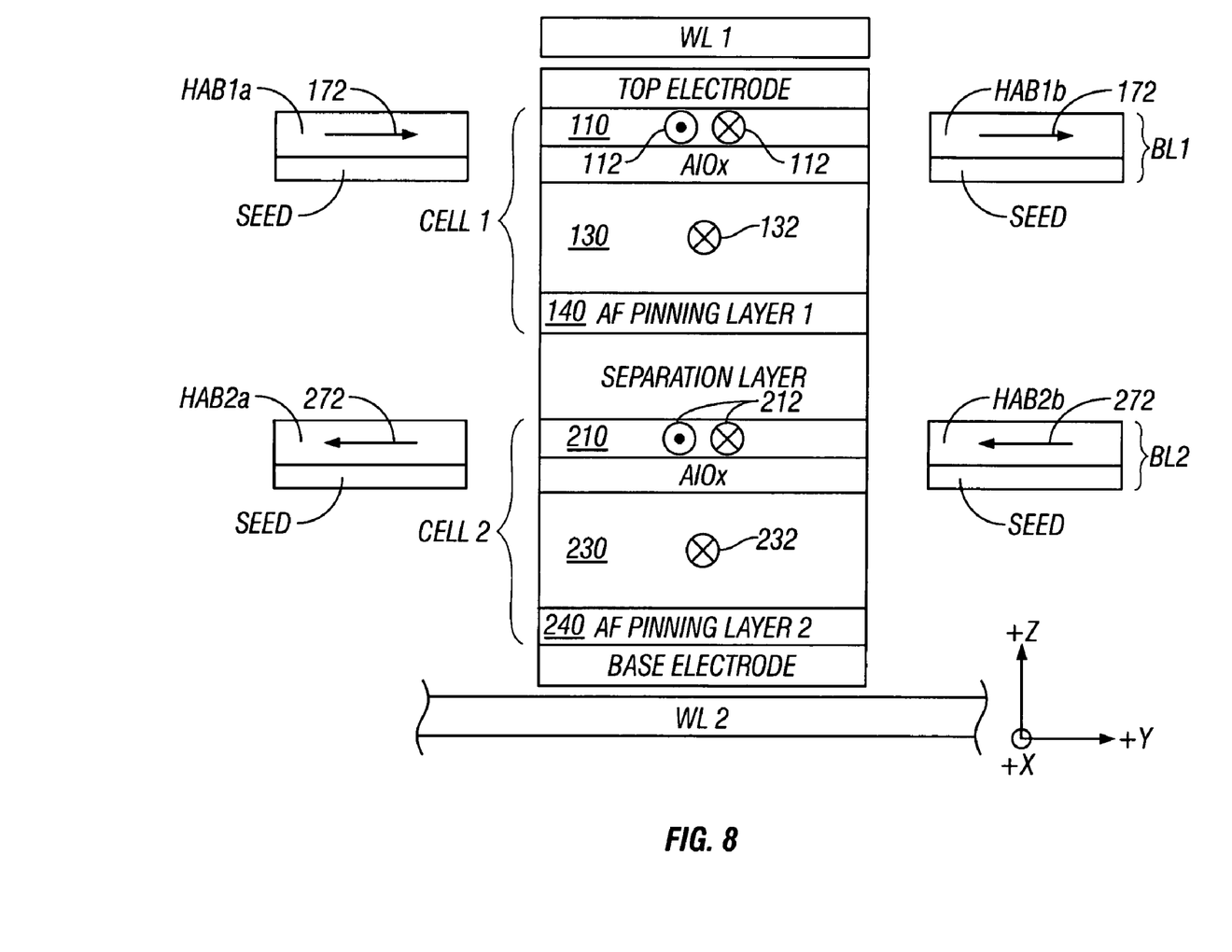
FIG. 8 shows an embodiment of the memory unit according to the present invention that uses biasing layers of hard magnets located outside the stack of memory cells.

FIG. 8 shows an embodiment of the memory unit that uses biasing layers of hard magnets without AF HAB pinning layers, and that has the biasing layers located outside the stack. BL2 associated with free layer 210 in cell 2 comprises two segments located on opposite sides of the stack, each segment being generally coplanar with free layer 210 and being formed of hard-axis bias (HAB) material formed on as suitable seed layer. HAB2a and HAB2b in the two BL2 segments have magnetization directions 272 directed in the −Y direction parallel to the hard axis of free layer 210. Similarly, BL1 associated with free layer 110 in cell 1 comprises two segments located on opposite sides of the stack, each segment being generally coplanar with free layer 110 and being formed of hard-axis bias (HAB) material formed on as suitable seed layer. HAB1a and HAB1b in the two BL1 segments have magnetization directions 172 directed in the +Y direction parallel to the hard axis of free layer 110 to generate a hard-axis biasing field in the +Y direction. HAB2a and HAB2b in the two BL2 segments have magnetization directions 272 directed in the −Y direction parallel to the hard axis of free layer 210 to generate a hard-axis biasing field in the −Y direction opposite to the hard-axis biasing field acting on free layer 110.

For the structure shown in FIG. 8, the layers making up the memory cells are formed and then patterned by etching to form the stack. After etching, an insulating dielectric, such as alumina, is refilled on the substrate, and then a seed layer material, such as Cr or TiW, and a permanent magnetic material, such as CoPtCr are patterned to form the two segments BL2. More insulation dielectric is refilled over BL2 and materials for a second seed layer and permanent magnet are deposited and patterned to form BL1. The two permanent magnets in BL2 and BL1 have different coercivities, Hc-high and Hc-low, to allow the magnetization directions 272, 172 to be set in opposite directions. A first applied magnetic field greater than Hc-high is used to set the high coercivity permanent magnet in the desired direction. A second magnetic field greater than Hc-low but less than Hc-high is applied in the opposite direction to set the low coercivity permanent magnetic in the desired direction. The strength of the biasing fields from the HAB1 and HAB2 permanent magnets is selected by appropriate choice of the net magnetic moment and/or thickness of the permanent magnets.

In the embodiment shown in FIG. 8 each biasing layer BL1, BL2 includes HAB segments formed of a hard (relatively high coercivity) or permanent ferromagnet, such as a ferromagnet made of a CoPt alloy, like a CoPtCr alloy. However, one of more of BL1 and BL2 can have its HAB segments formed of a ferromagnetic layer pinned by being exchange coupled to an AF HAB pinning layer, as shown for the in-stack biasing layers in the embodiment of FIG. 6.

In both the in-stack embodiment of FIG. 6 and the outside-the-stack embodiment of FIG. 8, the free layers are located above the pinned layers in both cells 1 and 2. However, in one or both cells the pinned layer can be located above the free layer. Referring to FIG. 6, if in cell 2 pinned layer 2 were to be located above free layer 2, then the biasing layer BL2 would be located below free layer 2 and above the base electrode. This structure for the memory unit 100 would place the two HAB layers farther apart from each other as well as place HAB1 farther from free layer 2 and HAB2 farther from free layer 1 to assure that each HAB layer provides magnetostatic coupling only to its associated free layer.

Figure 9:
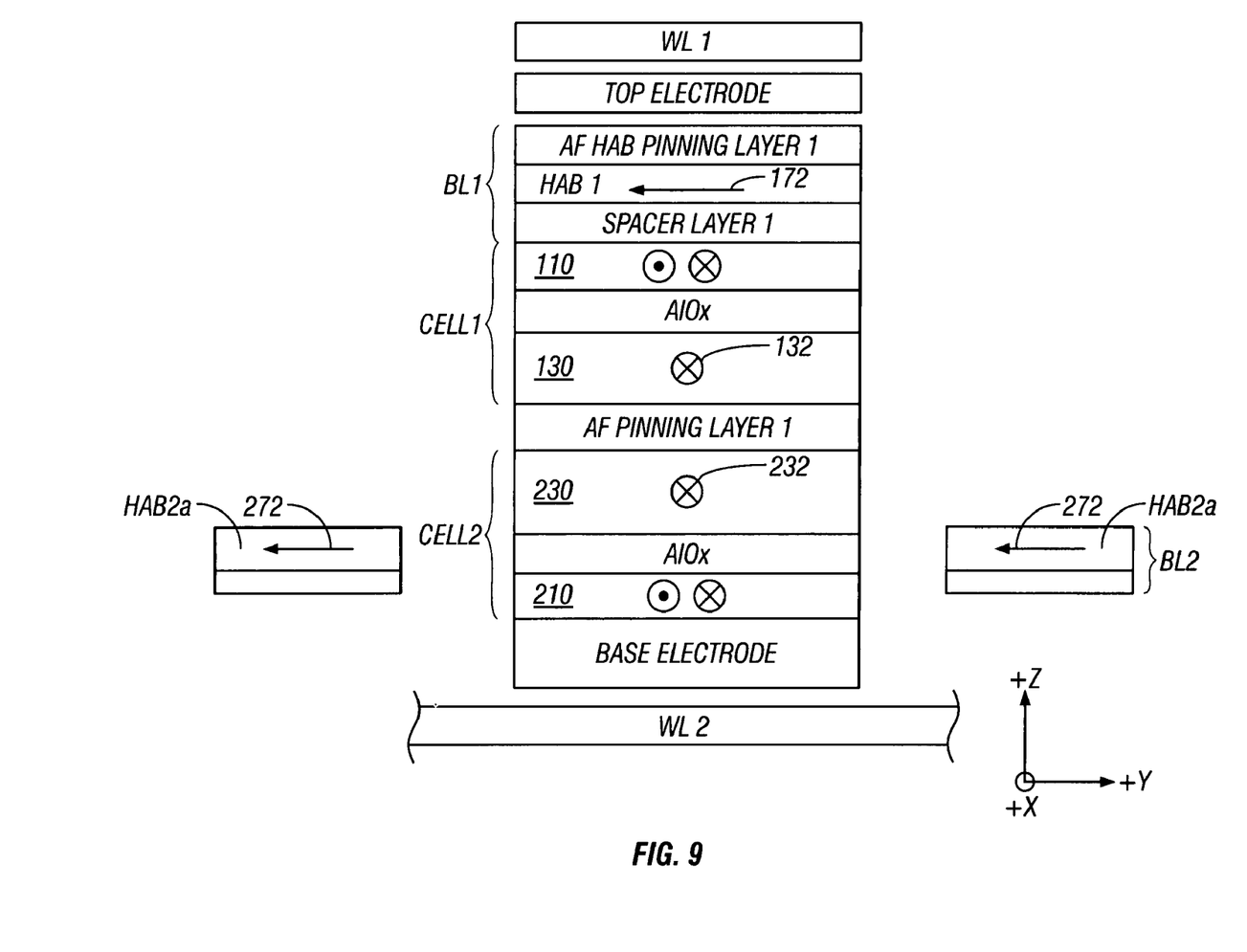
FIG. 9 shows an embodiment of the memory unit according to the present invention with one biasing layer located in the stack and the other biasing layer located outside the stack, with a common antiferromagnetic pinning layer that functions as the separation layer for the two cells.

Referring to FIG. 8, if in cell 2 pinned layer 2 were to be located above free layer 2 and the separation layer were to be removed, then a single common AF pinning layer could be used to pin both pinned layer 2 and pinned layer 1. This is shown in FIG. 9, which also shows that one biasing layer, e.g., BL1, can be located in the stack, and the other biasing layer, e.g., BL2, can be located outside the stack. The common AF pinning layer also functions as the separation layer for the two cells. Because BL1 is located in the stack and biases free layer 110 by magnetostatic coupling across spacer layer 1, and BL2 is located outside the stack and biases free layer 210 by direct magnetostatic coupling, the magnetization directions 172, 272 are parallel, even though their respective applied hard-axis biasing fields are antiparallel. BL1 uses an AF pinning layer and BL2 uses permanent magnets. This structure requires only two AF pinning directions, which can be achieved with two different AF materials having different blocking temperatures. The permanent magnets HAB2a and HAB2b can have their magnetization directions set without elevated temperature so as to not interfere with the AF exchange biasing.

Figure 10:
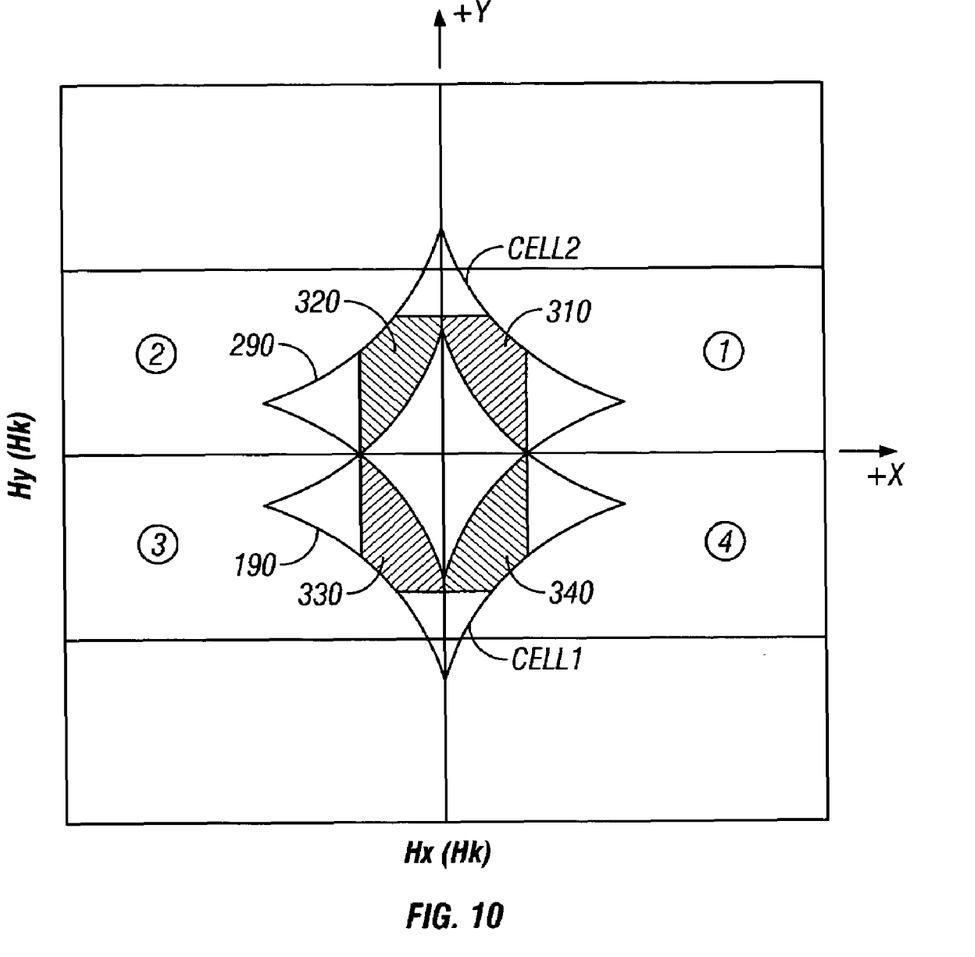
FIG. 10 shows the switching astroids for the two cells in the memory unit according to the present invention.

FIG. 10 shows the switching astroids for cells 1 and 2 with hard-axis biasing according to the present invention. In the presence of the biasing field oriented parallel to the hard-axis (the Y axis), the switching astroid for each cell is shifted. Cell 1 has a switching astroid with an outer boundary 190 and cell 2 has a switching astroid with an outer boundary 290. FIG. 10 shows an example where the biasing field is about 0.3 $H_k$ for each cell. For the first and second quadrants, where the hard-axis biasing field on cell 1 is assisting the write field, the switching threshold is reduced by about 40%. A similar reduction occurs in the third and fourth quadrants, where the hard-axis biasing field on cell 2 is assisting the writing. For higher biasing fields the switching field would be reduced even further. As a result, less write current is required, which reduces the power consumption of the MRAM.

With hard-axis biasing using a biasing field of about 0.3 $H_k$, the angle between the two quiescent magnetization states for the free layer in each cell is reduced from 180 degrees to about 140 degrees and the ΔR is reduced by about 10% compared to the cell without hard-axis biasing (unbiased case). This result indicates the possibility of reducing the write field, and thus the required write current levels, with modest trade off in resistance signal. As also shown in FIG. 10, the switching threshold for the write field in the third and fourth quadrants for cell 1 increases because the write field is opposed by the biasing field. Similarly, the switching threshold for the write field in the first and second quadrants for cell 2 increases because the write field is opposed by the biasing field.

The cross-hatched regions in FIG. 10 correspond to the write field windows where writing can be achieved for the selected cell without interferences to the half-selected cells in the MRAM. The regions 310, 320 are outside the boundary 190 of the switching astroid for cell 1 but inside the boundary 290 of the switching astroid for cell 2, which means that the writing of cell 1 can be achieved without affecting the magnetic state of cell 2. The regions 330, 340 are outside the boundary 290 of the switching astroid for cell 2 but inside the boundary 190 of the switching astroid for cell 1, which means that the writing of cell 2 can be achieved without affecting the magnetic state of cell 1.

Assuming that a +X direction for the magnetization of free layer 1 represents a "1", then the writing of the "1" magnetic state for cell 1 can be achieved by applying write currents in the +X and +Y directions to generate fields in the +Y and +X directions, respectively, with the composite field falling in region 310. Similarly, the writing of the "0" magnetic state for cell 1 can be achieved by applying write currents in the +X and −Y directions to generate fields in the +Y and −X directions, respectively, with the composite field falling in region 320. Assuming that a +X direction for the magnetization of free layer 2 represents a "1", then the writing of the "1" magnetic state for cell 1 can be achieved by applying write currents in the −X and +Y directions to generate fields in the −Y and +X directions, respectively, with the composite field falling in region 340. Similarly, the writing of the "0" magnetic state for cell 2 can be achieved by applying write currents in the −X and −Y directions to generate fields in the −Y and −X directions, respectively, with the composite field falling in region 330, a field in the shaded region in the first and second quadrant respectively.

As can be seen from FIG. 10, the value of the write currents can be the same, so that the write circuitry does not need to be capable of generating multiple levels or amplitudes of write current. In addition, the cells can be substantially identical. The cells can have the same shape in the X-Y plane and the ferromagnetic free layers can be formed of the same materials and thicknesses. This is because the free layers can have substantially the same uniaxial anisotropies. It is not required that the free layers have different coercivities and/or anisotropies to create different switching astroids, unlike the prior art shown in FIG. 4.

The invention has been described with the easy axes of the free layers in the memory cells in a memory unit being aligned parallel with one of the write lines. However, the easy axes do not need to be aligned exactly parallel with the write lines but can be only generally parallel so long as the angular spacing is close enough to assure that writing occurs as explained with the switching astroid of FIG. 10. Similarly, the invention has also been described with the magnetization directions of the biasing layers being aligned orthogonal to the easy axes of the free layers (parallel to the hard axes of the free layers). However, the magnetization directions of the biasing layers do not need to be aligned exactly 90 degrees with the easy axes so long as they are substantially orthogonal, i.e., greater than 45 degrees, provided their angular alignment enables writing in the manner explained with the switching astroid of FIG. 10.

Each MTJ cell in the two-memory-cell unit can be a "1" or a "0", so there are four possible magnetic states for the unit. These states are represented by (cell 1 state, cell 2 state) as (1,1), (1,0), (0,1) and (0,0). If the two cells have the same resistance difference, ΔR, between the "1" and "0" states, a conventional comparator can only detect 3 resistance levels instead of the 4 needed. However, by fabricating cell 1 and cell 2 with different MTJ materials so that the cells have different ΔR values, four distinguishable resistance levels can be detected. For example, if ΔR of cell 1 is at least twice the ΔR of cell 2 the four states can be determined from the four net resistance levels, with the highest resistance being (1,1) followed by (1,0), (0,1) and (0,0). Published patent application US20020036331A1 describes an MRAM with a memory unit of two stacked conventional MTJ cells in which the ferromagnetic layers in the cells have different coercivities so that the cells have different ΔR values. The logic state of this memory unit is read by applying a voltage across it and determining the magnitude of a sense current that flows through the memory cell, with the magnitude of the sense current being proportional to the total resistance of the two series-connected MTJ cells. Different ΔR values of the two MTJs cells can also be achieved by fabricating the cells with different tunnel barrier thicknesses. This is readily achievable because the resistance-area product (RA) for magnetic tunnel junctions can be made to span 2-3 orders of magnitude for a given barrier material. For example, while the typical MTJ cell for an MRAM has a RA of approximately 1 k$\Omega\mu m^2$ the typical MTJ for a magnetoresistive sensor for recording head applications has RA well below 5 $\Omega\mu m^2$. The advantage of making the cells have different ΔR values by varying the tunnel barrier thickness is that the magnetic properties of the free layers for the two MTJ cells can still be made nearly the same.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetic random access memory (MRAM) comprising:
   a substrate;
   a plurality of first and second electrically conductive lines on the substrate, the second lines being located between the substrate and the first lines with the first lines overlapping the second lines and spaced from the second lines in a generally perpendicular direction from the substrate to define a plurality of intersection regions, the first line and second line at each intersection region being generally orthogonal;
   a plurality of memory stacks, each memory stack located in an intersection region and comprising (a) a first memory cell having a pinned ferromagnetic layer, a free ferromagnetic layer with an in-plane easy axis of magnetization aligned generally parallel with one of said first and second lines, and a nonmagnetic coupling layer between the pinned and free layers, (b) a second memory cell having a pinned ferromagnetic layer, a free ferromagnetic layer with an in-plane easy axis of magnetization aligned substantially parallel with the easy axis of magnetization of the free layer of the first cell, and a nonmagnetic coupling layer between the pinned and free layers, and (c) a nonmagnetic separation layer between said two memory cells;
   a first biasing layer magnetically coupled to the free layer of the first cell in each stack and having an in-plane magnetization direction substantially orthogonal to the easy axis of the free layer of the first cell for applying a hard-axis biasing field to the free layer of the first cell; and
   a second biasing layer magnetically coupled to the free layer of the second cell in each stack and having an in-plane magnetization direction substantially orthogonal to the easy axis of the free layer of the second cell for applying a hard-axis biasing field to the free layer of the second cell, the hard-axis biasing field applied to the free layer of the second cell being substantially antiparallel to the hard-axis biasing field applied to the free layer of the first cell.

2. The MRAM of claim 1 wherein the substrate is parallel to the X-Y plane of an X-Y-Z coordinate system and a direction perpendicular to the substrate is parallel to the Z axis, wherein the first lines are mutually parallel and parallel to the X axis, the second lines are mutually parallel and parallel to the Y axis, and the memory cells in each memory stack are stacked parallel to the Z axis.

3. The MRAM of claim 1 wherein at least one of the first and second biasing layers for each stack is generally coplanar with its associated free layer and comprises a pair of biasing layer segments, each segment located on an opposite side of said associated free layer outside the stack.

4. The MRAM of claim 1 wherein at least one of the first and second biasing layers for each stack is located in the stack and further comprising a nonmagnetic spacer layer in the stack between each of said first or second biasing layers and its associated free layer.

5. The MRAM of claim 1 wherein at least one of the first and second biasing layers for each stack comprises a single layer of relatively-high-coercivity ferromagnetic material.

6. The MRAM of claim 1 wherein at least one of the first and second biasing layers for each stack comprises a layer of ferromagnetic material and a layer of antiferromagnetic material exchange-coupled with said ferromagnetic layer.

7. The MRAM of claim 1 wherein the first cell is above the second cell on the substrate, the free layer of the first cell is above the pinned layer of the first cell, and the pinned layer of the second cell is above the free layer of the second cell.

8. The MRAM of claim 7 further comprising an antiferromagnetic pinning layer located between and exchange coupled to the pinned layers of the first and second cells, said antiferromagnetic pinning layer being said separation layer.

9. The MRAM of claim 1 wherein each of the memory cells is a magnetic tunnel junction (MTJ) cell and wherein each nonmagnetic coupling layer is a tunnel barrier.

10. The MRAM of claim 1 wherein each memory cell has an electrical resistance difference $\Delta R$ between the parallel and antiparallel alignment of its free and pinned layer magnetization directions, and wherein the $\Delta R$ of the first memory cell is substantially different from the $\Delta R$ of the second memory cell.

11. The MRAM of claim 1 wherein each memory cell is a magnetic tunnel junction (MTJ) cell and each nonmagnetic coupling layer is a tunnel barrier, and wherein the tunnel barrier thickness of the first MTJ cell is substantially different from the tunnel barrier thickness of the second MTJ cell.

12. The MRAM of claim 1 wherein the easy axis of magnetization of the free layer in each cell is the axis of anisotropy induced by the shape of the cell.

13. The MRAM of claim 1 wherein the pinned layer in each memory cell is an AP-pinned layer.

14. The MRAM of claim 1 further comprising a plurality of transistors between the substrate and the second lines, and wherein each memory stack is electrically connected to a transistor.

15. The MRAM of claim 14 further comprising circuitry coupled to the transistors for detecting the electrical resistance across the memory stacks.

16. The MRAM of claim 1 further comprising write circuitry for directing electrical current bidirectionally to the first and second lines.

17. The MRAM of claim 1 wherein each of the first lines comprises a pair of coplanar spaced lines and each of the second lines comprises a pair of coplanar spaced lines and wherein the region between the overlapping pairs of coplanar lines is an intersection region.

18. A magnetic random access memory (MRAM) comprising:
  a substrate parallel to an X-Y plane of an X-Y-Z coordinate system;
  a plurality of memory units on the substrate and aligned parallel to the Z axis, each memory unit comprising (a) a first magnetic tunnel junction (MTJ) cell having a free ferromagnetic layer with an easy axis of magnetization aligned in an X-Y plane generally parallel to the X axis, (b) a second magnetic tunnel junction (MTJ) cell having a free ferromagnetic layer with an easy axis of magnetization aligned in an X-Y plane generally parallel to the X axis, and (c) a nonmagnetic separation layer between said first and second cells;
  a first biasing layer for each memory unit and magnetically coupled to the free layer of the first cell for applying a biasing field generally in the +Y direction;
  a second biasing layer for each memory unit and magnetically coupled to the free layer of the second cell for applying a biasing field generally in the −Y direction;
  a plurality of first electrically conductive lines substantially parallel to the X axis;
  a plurality of second electrically conductive lines substantially parallel to the Y axis; and
  write circuitry coupled to the first and second lines for directing electrical current bidirectionally to the first and second lines.

19. The MRAM of claim 18 wherein the first and second MTJ cells have substantially the same shape in the X-Y plane.

20. The MRAM of claim 18 wherein the free layers in the first and second MTJ cells have substantially the same uniaxial anisotropies.

21. The MRAM of claim 18 wherein at least one of the first and second biasing layers for each memory unit is generally coplanar with its associated free layer and comprises a pair of biasing layer segments, each segment located on an opposite side of said associated free layer outside the stack.

22. The MRAM of claim 18 wherein at least one of the first and second biasing layers for each memory unit is located in the stack and further comprising a nonmagnetic spacer layer in the stack between each of said first or second biasing layers and its associated free layer.

23. The MRAM of claim 18 wherein at least one of the first and second biasing layers for each memory comprises a single layer of relatively-high-coercivity ferromagnetic material.

24. The MRAM of claim 18 wherein at least one of the first and second biasing layers for each memory unit comprises a layer of ferromagnetic material and a layer of antiferromagnetic material exchange-coupled with said ferromagnetic layer.

25. The MRAM of claim 18 wherein each MTJ cell includes a ferromagnetic pinned layer, and further comprising an antiferromagnetic pinning layer located between and exchange coupled to the pinned layers of the first and second cells, wherein said antiferromagnetic pinning layer is said nonmagnetic separation layer.

26. The MRAM of claim 18 wherein each memory unit is located between one of the second lines and one of the first lines.

27. The MRAM of claim 18 wherein each of the first lines comprises a pair of coplanar spaced lines and each of the second lines comprises a pair of coplanar spaced lines and wherein each memory unit is located between the pairs of first and second lines.

28. The MRAM of claim 18 further comprising a plurality of transistors on the substrate, and wherein each memory unit is electrically connected to a transistor.

29. The MRAM of claim 18 wherein each cell has an electrical resistance difference $\Delta R$ between two antiparallel orientations of its free layer magnetization, and wherein the $\Delta R$ of the first cell is substantially different from the $\Delta R$ of the second cell.

30. The MRAM of claim 29 further comprising read circuitry coupled to the transistors for detecting the electrical resistance across the memory units.

31. A stack of magnetic tunnel junction (MTJ) memory cells on the substrate of a magnetic random access memory (MRAM), the MRAM substrate being parallel to an X-Y plane of an X-Y-Z coordinate system and the stack extending from the substrate along the Z axis, the stack comprising:
 a first MTJ cell having a free ferromagnetic layer with an easy axis of magnetization aligned in an X-Y plane generally parallel to the X axis and a hard axis of magnetization generally parallel to the Y axis;
 a first biasing layer magnetically coupled to the free layer of the first cell for applying a hard-axis biasing field to the free layer of the first cell generally in the +Y direction;
 a second MTJ cell having a free ferromagnetic layer with an easy axis of magnetization aligned in an X-Y plane generally parallel to the X axis and a hard axis of magnetization generally parallel to the Y axis;
 a second biasing layer magnetically coupled to the free layer of the second cell for applying a hard-axis biasing field to the free layer of the second cell generally in the −Y direction; and
 a nonmagnetic separation layer between said first and second MTJ cells.

* * * * *